United States Patent [19]

Morrise

[11] Patent Number: 4,839,910
[45] Date of Patent: Jun. 13, 1989

[54] COUNTER WITH GLITCHLESS TERMINAL COUNT INDICATION

[75] Inventor: Matthew C. P. Morrise, Provo, Utah

[73] Assignee: North American Philips Corporation, Signetics Division, Sunnyvale, Calif.

[21] Appl. No.: 149,286

[22] Filed: Jan. 28, 1988

[51] Int. Cl.$^4$ ............................................. H03K 21/40
[52] U.S. Cl. ........................................ 377/28; 377/56; 377/33
[58] Field of Search ....................... 377/28, 29, 30, 33, 377/56

[56] References Cited

U.S. PATENT DOCUMENTS

| | | | |
|---|---|---|---|
| 4,135,150 | 1/1979 | Quigley | 377/33 |
| 4,363,123 | 12/1982 | Grover | 377/28 |
| 4,628,521 | 12/1986 | Nishimura | 377/30 |
| 4,661,930 | 4/1987 | Tran | 377/28 |
| 4,745,630 | 5/1988 | Underwood | 377/33 |

FOREIGN PATENT DOCUMENTS 53-142161 12/1978 Japan .

OTHER PUBLICATIONS

Signetics Corp., *TTL Data Manual*, 1986, Chap. 6, pp. 142-145, 467-471.
*EDN*, Sep. 20, 1974, "Decode Ripple Counter Outputs the Glitchless Way", by T. M. Farr.

*Primary Examiner*—John S. Heyman
*Attorney, Agent, or Firm*—R. Meetin; D. Treacy; T. Briody

[57] ABSTRACT

A glitchless terminal count indication digital counter having a clock signal as an input thereto is disclosed and comprises a state logic means comprised of a plurality of DQ flip-flops for providing a digital count with the clock signal being sent to an input thereof, a next state decode means, a next terminal count decode means for providing an indication at its output that the digital output count will reach a terminal count at the next clock cycle, and a terminal count logic means for obtaining the indication from the next terminal count decode means and providing therefrom at the next clock cycle a glitchless terminal count indication. The next state decode means has inputs and outputs, with the digital count being an input thereto, and the state logic means and the next terminal count decode means being coupled to the output thereof. The terminal count logic means is preferably comprised of at least one D-type flip-flop having both a clock signal and the next terminal count decode means as inputs thereto, and logic circuitry for forcing the output terminal to indicate the reaching of a terminal count. When the next terminal count decode means senses the penultimate count, it changes the value of its signal which is supplied to the flip-flop of the terminal count logic means. Thus, upon the next rising clock signal, the terminal count flip-flop will change its output and, via the logic circuitry, will force the output terminal of the counter to assume a terminal count value.

14 Claims, 2 Drawing Sheets

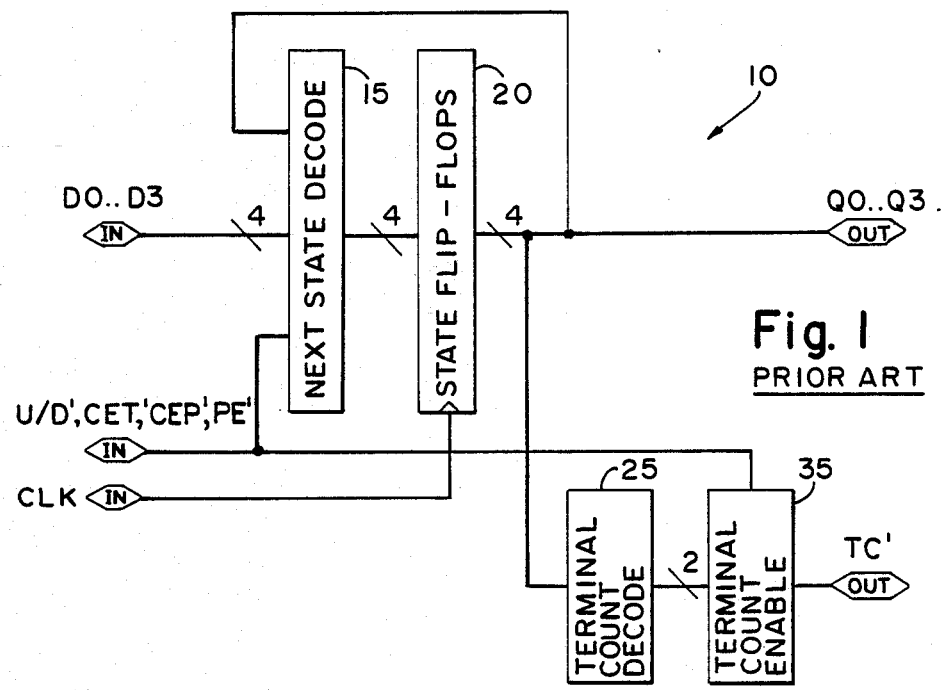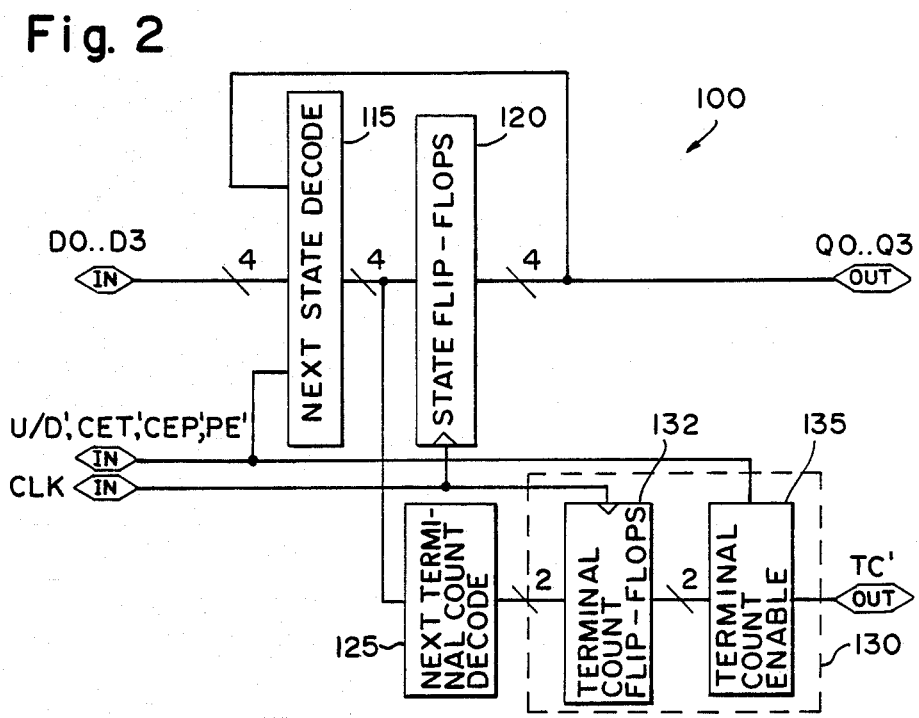

COUNTER WITH GLITCHLESS TERMINAL COUNT INDICATION

BACKGROUND OF THE INVENTION

1. Field of Use

The present invention relates to digital counters. More particularly, the present invention relates to digital counters having a glitchless terminal count indication for use with high speed control or sequencing systems.

2. Background Art

Many different types of digital counters having numerous desirable features are known in the art. For example, bidirectional synchronous binary or decade counters with preset capabilities for programmable operation and lookahead carry capabilities are available as integrated circuits under Signetics product numbers 74F168, 74F169, 74F568, and 74F569. The latter two products provide additional features such as a master reset which overrides all other inputs, a synchronous reset which overrides counting and parallel loading, and a clocked carry output which can be used as a clock for flip-flops, registers, and counters. While such counters and other counters of the art have many desirable features, they are prone to occasional glitches at the terminal count signal output due to unequal delays of the output lines, as may be seen with reference to the prior art counter of FIG. 1.

As shown in FIG. 1, a four bit counter 10 comprises a next state decode 15, state flip-flops 20, a terminal count decode 25 and a terminal count enable circuit 35. The next state decode has a our bit preset input (D0...D3) as well as up/down direction (U/D'), count enable trickle (CET'), count enable parallel (CEP'), and parallel enable (PE') active low control inputs. The four bit output of the next state decode 15 is coupled to the input of the state flip-flops 20 and provides the state flip-flops with the code representing the state that the state flip-flops will assume at the next clock cycle. The state flip-flops 20 which receive the clock signal (CLK) provides at its output an output count (Q0...Q3) which is also used as feedback to the next state decode 15. The output of the state flip-flops 20 is further provided to the terminal count decode 25 which causes, upon the recognition of a terminal count, the terminal count enable circuit 35 to provide a terminal count signal upon reaching the terminal count. Because each of the four bits of the output of the state flip-flops can experience different delays, glitches in the terminal count signal TC' (e.g. "1111" for a four-bit up count, and "0000" for a four bit down count) can occur. For example, when the state flip-flops are changing from a digital output of "0111" to "1000", if the most significant bit changes before the any of the other bits change, a terminal count signal "1111" may be seen by the terminal count decode 25. Despite the fact that the duration of the terminal count signal would be brief, a glitch at the output might occur. Similar incorrect terminal count signals, depending on the speeds of the state flip-flop output lines are possible at the digital transition from "1011" to "1101" and "1101" to "1110".

In order to eliminate terminal count glitches such as might occur in the circuitry of FIG. 1, many counters such as the above-referenced 74F568 and 74F569 counters have utilized a gated carry output. While terminal count output glitches are eliminated by the gated carry output, the advantageous results come at the cost of additional circuitry and a terminal count indication which extends only for a partial width of the clock pulse. Circuits such as disclosed in Japanese Kokai No. 53-142161 which replace the gated carry with a flip-flop, still only provide a terminal count which extends for at most one half a clock period. Moreover, such a circuit tends to be slower, which is disadvantageous in an environment demanding increasingly faster circuits.

Finally, a glitchless counter using different principles is disclosed by T.M. Farr, Jr., in *EDN*, 19, nr.18, Sept. 20, 1974 (p.78). The provided counter is implemented with first and second levels having a plurality of T-type flip-flops, where the "Q" output of each stage of the first level is connected to the "T" (toggle) input of the corresponding stage of the second level. The resulting glitchless counter, however, has various drawbacks such as the output being a Gray code output, and the circuitry requiring approximately twice as many flip-flops as are required in the typical counters of the art. Moreover, the provided counter is designed to remove glitches on the Q outputs of the flip-flops rather than on the total count output indicator.

SUMMARY OF THE INVENTION

It is therefore an object of this invention to provide a digital counter having a glitchless terminal count indication.

It is a further object of this invention to provide a fast, glitchless, terminal count indication counter where the terminal count extends for a full clock period.

In accord with the objects of the invention, a glitchless terminal count indication digital counter having a clock signal as an input thereto is provided and essentially comprises a state logic means for providing a digital count with the clock signal being sent to an input thereof, a next state decode means for providing the state logic means with a code representing the state that the state logic means is to assume at a next clock cycle, a next terminal count decode means for providing an indication at its output that the digital output count will reach a terminal count at the next clock cycle, and a terminal count logic means for obtaining the indication from the next terminal count decode means and providing therefrom at the next clock cycle a glitchless terminal count indication. The next state decode means has inputs and outputs, with the digital count being an input thereto, and the state logic means and the next terminal count decode means being coupled to the output thereof.

Preferably, the state logic means is comprised of a plurality of D-type flip-flops, one for each bit of the binary count. The terminal count logic means is preferably comprised of at least one D-type flip-flop having both a clock signal and the next terminal count decode means as inputs thereto, and logic circuitry for forcing the output of the terminal count logic means to assume a terminal count value. When the next terminal count decode means senses the penultimate count, it changes the value of its signal (i.e. provides an indication that the next clock signal wil cause a terminal count) which is supplied to the flip-flop of the terminal count logic means. Thus, upon the next rising clock signal, the terminal count flip-flop will change its output and, via the logic circuitry, will force the output terminal of the terminal count logic means to assume a terminal count value.

The glitchless terminal count indicator of the invention also preferably includes various desirable features of the art. Thus, a logical count preset means for accepting digital data input signals as an initial count and for causing the state logic means to assume a corresponding count is provided for programmable applications. Likewise, count direction logic means are provided for permitting up or down counting.

A better understanding of the invention, and additional advantages and objects of the invention will become apparent to those skilled in the art upon reference to the detailed description and the accompanying drawings.

BRIEF DESCRIPTION OF THE DRAWINGS

FIG. 1 is a block diagram of a typical four bit digital counter of the prior art;

FIG. 2 is a block diagram of a four bit counter incorporating the invention.

DETAILED DESCRIPTION OF THE PREFERRED EMBODIMENT

Figure 3:
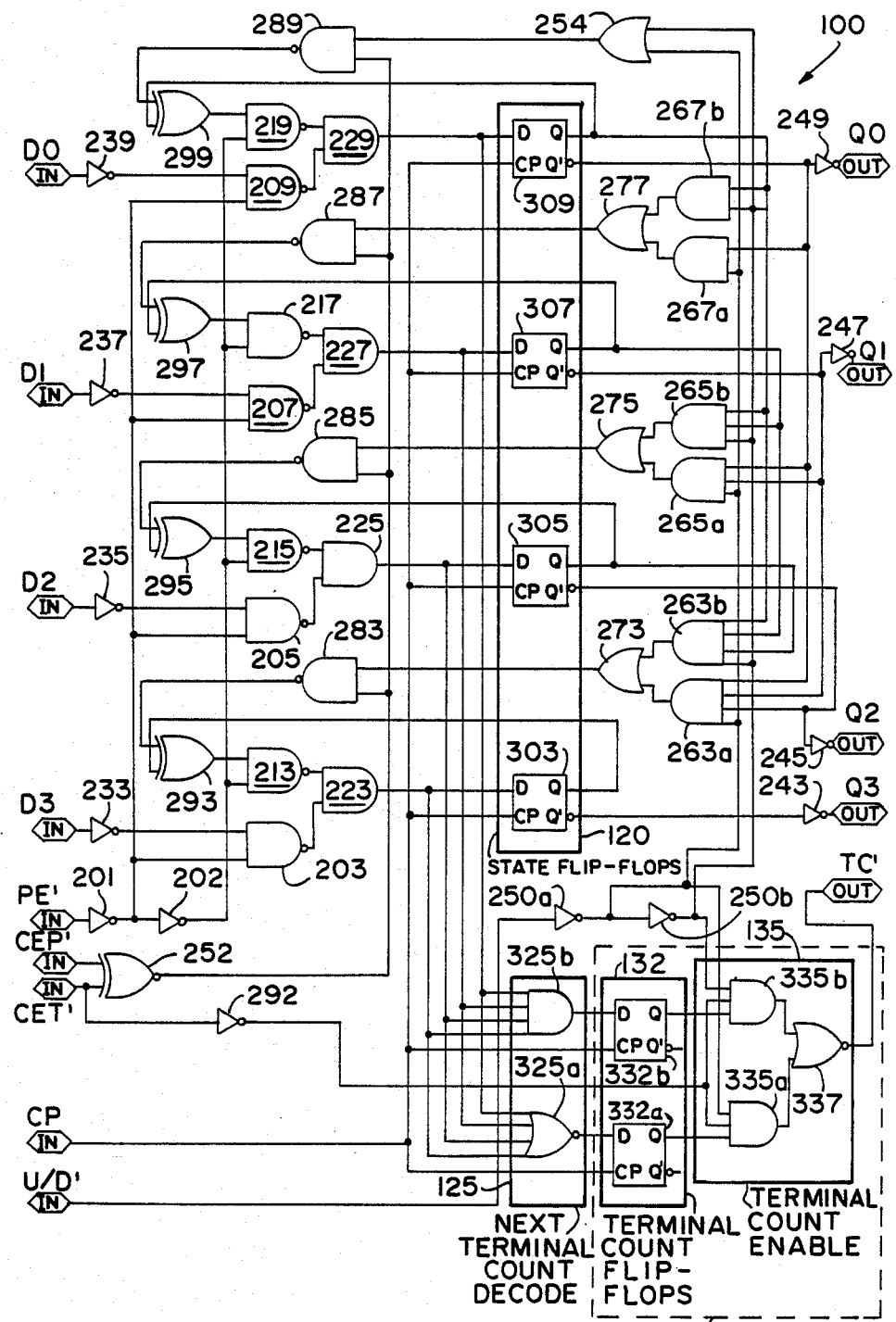
FIG. 3 is a logic diagram of a four bit counter incorporating the invention.

Turning to FIG. 2, a block diagram of the glitchless terminal count output counter of the invention is seen. As will be appreciated by those skilled in the art, the four bit counter 100 of the invention is comprised of many of the same elements of the prior art counter of FIG. 1. Thus, four bit counter 100 includes a next state decode 115, state flip-flops 120, a next terminal count decode 125, and a terminal count logic circuit 130 which includes terminal count flip-flops 132 and a terminal count enable means 135. The primary distinctions between the counter 10 of the art and the counter 100 of the invention are that counter 100 has a next terminal count decode 125 which is coupled to the output of the next state decode 115 while counter 10 has a terminal count decode 25 coupled to the output of the state flip-flops 20, and that counter 100 further includes logic circuitry, preferably in the form of clocked terminal count flip-flops 132, before the terminal count enable means. The control inputs into the counter 100 of the invention include the same control inputs of the counter 10 of the prior art, including a four bit preset input (D0...D3), as well as the active low up/down direction (U/D'), count enable trickle (CET'), count enable parallel (CEP'), and parallel enable (PE') control inputs.

A more detailed understanding of the functioning of counter 100 may be had with reference to the logic diagram of FIG. 3. As indicated therein, counter 100 preferably has data inputs D0, D1, D2, and D3, a clock input CP with an active rising edge, and active low count enable parallel CEP', count enable trickle CET', parallel enable PE', and up-down direction U/D' control inputs. Also, control 100 preferably has a four bit output Q0-Q3, and a glitchless active low terminal count output TC'. Preferably, all FIG. 3 components are functionally equivalent to standard TTL components as follows:

| COMPONENT | Part Number |
| --- | --- |
| Inverters | 7404 |
| 2-input AND gates | 7408 |
| 3-input AND gates | 7411 |
| 4-input AND gates | 7421 |
| 2-input NAND gates | 7402 |
| 2-input OR gates | 7432 |
| 2-input NOR gates | 7400 |
| 4-input NOR gates | 7425 |
| Exclusive OR gates | 7486 |
| Flip-flops | 7474 |

The parallel enable PE' control permits a desired four bit value as set by data inputs D0-D3 to be loaded into the state flip-flop means 120 which is comprised of flip-flops 303, 305, 307 and 309. When the parallel enable PE' control is low, inverter 201 inverts the signal and provides a high signal to NAND gates 203, 205, 207 and 209. Likewise, inverter 202 inverts the inverted signal (i.e. to obtain a signal of the same logical polarity as the original signal) and provides a low signal to NAND gates 213, 215, 217, and 219, thereby guaranteeing that NAND gates 213, 215, 217, and 219 will provide a high signal to AND gates 223, 225, 227, and 229. Thus, when the parallel enable control is active, the second inputs into the AND gates control the values sent to the state flip-flops. For example, if the input D3 is high, inverter 233 provides a low signal to NAND gate 203 which provides a high signal to AND gate 223. Because the other input into AND gate 223 is already high, the value at the D input into flip-flop 303 of state flip-flops 120 goes high. On the other hand, if the input D3 is low, inverter 233 provides a high signal to NAND gate 203 which provides a low signal to AND gate 223 because the other input into NAND gate 203 is high when the parallel enable signal is active. With a low signal being input to AND gate 223, AND gate 223 provides a low signal to the D input of flip-flop 303. Thus, the input into the flip-flop follows the data input. Inverters 235, 237, and 239 similarly help permit data inputs D2, D1, and D0 respectively to gate their values through to flip-flops 305, 307 and 309.

With the parallel enable control PE' inactive (high), the counter 100 is free to count when the count enable parallel CEP' control is active (low). If, for example, the starting values at the D inputs of state flip-flops 120 are "0000" (zero), at the first block pulse CP, the "0" or low state is clocked through to the Q outputs of state flip-flops 303, 305, 307, and 309. The Q' outputs of the state flip-flops all have a high value which are inverted by inverters 243, 245, 247, and 249 to provide an output count of "0000". If the counter 100 is the up-count state (i.e. the U/D' control input is high), the next state decode circuitry then provides values of 0, 0, 0, and 1 to the D inputs of flips flops 303, 305, 307, and 309 respectively, as will be discussed hereinafter.

With the U/D' control input high, inverter 250a provides a low output and inverter 250b provides a high output. As will be seen hereinafter, the low output of inverter 250a causes all down-count circuitry (all having reference numerals ending in "a") to be effectively turned off, while the high output of inverter 250b permits the up-count circuitry (all having reference numerals ending in "b") to be effective. For example, where the output of inverter 250a is low and the output of inverter 250b is high, AND gates 263a, 265a, and 267a, will all be provided with a low input and will therefore, regardless of the other inputs into the AND gates, provide OR gates 273, 275, and 277 with a low input. With the output of inverter 250b being high, at least one input into AND gates 263b, 265b, and 267b will be high. Conversely, if the output of inverter 250a was high and the output of inverter 250b was low (count down), AND gates 263b, 265b, and 267b would have at least one input at a low level, thereby providing OR gates 273, 275, and 277 with a low input, while AND gates 263a, 265a, and 267a would all have at least one input being high.

In the up-count state, the Q outputs of the state flip-flops control the next state decode circuitry. The Q outputs are fed to an exclusive OR XOR) gate for the respective logic bit. Except for the Q output of the MSB, the Q outputs are also fed to the up-count AND gates of the more significant logic bits, thereby providing the binary control as will become more apparent hereinafter. Thus, where the initial count is "0000", the Q output of state flip-flop 309 is sent to one input of XOR gate 299. The other input into XOR gate 299 comes from the count enable controls CEP' and CET'. If both count enable controls are active (low), the output of NOR gate 252 is low, thereby providing a high input into NAND gates 283, 285, 287 and 289. With a first input into NAND gate 289 high, and the second input from OR gate 254 high (the output of OR gate 254 always having a high value because one of inverters 250a and 250b will always be high), NAND gate 289 will provide a low input into XOR gate 299. With both inputs low, XOR gate 299 will provide a low output which is inverted by NAND gate 219 and fed as a high value to AND gate 229. Because the other input to AND gate 229 will always be high when the PE' control is disabled (high), a high value is generated at the D input into flip-flop 309.

With the starting value of "0000", the next state decode circuitry will generate low values at the D inputs of state flip-flops 307, 305 and 303. With the Q output of state flip-flop 309 being low, at least one input into each of up-count AND gates 267b, 265b, and 263b is low, thereby providing a low output at NOR gates 277, 275 and 273. In such a state, NAND gates 287, 285 and 283 act as inverters and provide a high value to one input of XOR gates 297, 295 and 293. Since the other inputs to the respective XOR gates come from the Q outputs of the flip-flops of the corresponding logic bits, XOR gates 297, 295, and 293 will all provide a high value. With two high values being provided to NAND gates 217, 215, and 213, a low value will be provided to the inputs of AND gates 227, 225, and 223, and hence to the D inputs of flip-flops 307, 305 and 303. Hence, with a starting value of "0000", the next state decode provides a value of "0001" to the D inputs of the state flip-flops.

For sake of brevity, a detailed description of the next state decode for each count will not be described as those skilled in the art will recognize that the provided circuitry will permit the proper count to be generated at the D inputs of the state flip-flops. It should suffice to note the following points. First, the next state decode for the least significant bit (LSB) continuously alternates. This occurs because one input into XOR gate 299 is always low, and the other input is the Q output of the LSB state flip-flop. Thus, if the Q output is low, XOR gate 299 provides a high value which is inverted and sent to the D input of flip-flop 309, while if the Q output is high, XOR gate 299 provides a low value which is inverted and sent to the D input. Second, the next state decode for the second bit will alternate on an every-other clock basis. The every-other nature of the second bit follows from the fact that AND gate 267b will only provide a high value when the Q output of state flip-flop 309 is high. When the AND gate 267b provides a high output, NAND gate 287 inverts the high value and provides XOR gate 297 with a low input. With one input into XOR gate 297 low, the next state decode logic for the second bit provides the inverse of the current Q output of flip-flop 307 to the D input of flip-flop 307. However, where the Q output of the LSB is low, the outputs of AND gate 267b and OR gate 277 are low. Thus, NAND gate 287 provides XOR gate 297 a high value. With one input into XOR gate 297 high, the circuitry including XOR gate 297, NAND gate 217 and AND gate 227 provides the identical value of the Q output of flip-flop 307 to its D input.

A third point of note with respect to the next state decode circuitry is that the third and fourth bits will respectively change values on an every fourth and every eighth clock cycle. These functions are accomplished in nearly an identical manner to the every-other nature of the second bit. Thus, AND gates 265b and 263b are provided so that OR gates 275 and 273 will only go high when all the Q outputs of the bits less significant than the bit in issue are at a high value ("1"). If the AND gate 265b or 263b provides a high value, the Q output of the state flip-flop for that bit regardless of value is inverted and provided to the D input of the state flip-flop for that bit. If the AND gate 265b or 263b does not provide a high value, the value at the Q output of the state flip-flop for that bit is regenerated at the D input into that state flip-flop.

Finally, with respect to the next state decode logic, it will be appreciated that if the counter 100 is arranged to count down (i.e. the U/D' control input is low), the above-described circuitry will work in a very similar fashion. However, instead of the Q outputs of the state flip-flops of the lesser significant bits being fed to the up-count AND gate for that particular bit circuitry, the Q' outputs of the state flip-flops of the lesser significant bits are fed to the down-count AND gates (263a, 265a, and 267a). Thus, when the Q output values of all lesser significant bits have reached zero, the Q' outputs are all high, and will cause the output of the down-count AND gate to go high. With the down-count AND gate high, the remaining circuitry causes the D input for that bit to be the inverse of the Q output, thereby effectively toggling the bit value.

As seen in FIG. 3, the values at the D inputs to the state flip-flops are all coupled to the next terminal count decode circuitry 125 which includes a NOR gate 325a and an AND gate 325b. When the counter is at its penultimate up-count ("1110"), and the signals at the D inputs of state flip-flops 120 are all high ("1111"), the output of AND gate 325b goes high. Upon the rising edge of the next clock signal (cycle), the high value at the D input into flip-flop 332b of the terminal count circuitry is transferred to the Q output of flip-flop 332b thereby providing a first high input into AND gate 335b of the terminal count circuitry. If the terminal count control signal CET' is enabled, inverter 292 provides a second high input, while the third high input is provided by a high U/D' control signal and inverters 250a and 250b. In this manner, at the rising edge of that next clock cycle, all the inputs to AND gate 335b of the terminal count circuitry go high, causing NOR gate 337 to provide a low terminal count signal which is indicative of a final terminal count. Simultaneously, at the rising edge of the clock scyle, the "1111" signal at the D inputs into the state flip-flops will be transferred to the Q outputs of state flip-flops 120, thus causing a terminal count of "1111" to be received at terminals Q0, Q1, Q2, and Q3.

If the counter 100 is counting down, when the counter is at its penultimate down-count ("0001"), and the signals at the D inputs into state flip-flops 120 are all zero, the output of NOR gate 325a goes high. At the rising edge of the next clock signal, the high value is transferred from the D input of terminal count circuitry flip-flop 332a to the Q output of flip-flop 332a, thereby causing AND gate 335a to go high, provided the terminal count control (CET') is enabled and the U/D' control is low. Again, with a high input into NOR gate 337, the terminal count signal will go low to indicate a terminal count. Simultaneously, the zero values at the D inputs into state flip-flops 120 are transferred to the Q outputs, thereby providing a "0000" value at the Q0-Q3 outputs of the counter 100.

The counter of FIG. 3 provides a terminal count indication for a full clock cycle as the terminal count circuitry flip-flops and logic circuitry change values simultaneous with the changing of the state flip-flops values (i.e. at the rising edge of the clock cycle). In fact, the provided terminal count indication TC' is substantially glitchless due to the terminal count indication only being obtained after an indication is transferred from the D input of a terminal count flip-flop to the Q output. Thus, any glitches due to the delay in the lines will have well settled before whatever value located at the D input of the terminal count flip-flop is transferred to the Q output.

There has been described and illustrated herein a digital counter having a glitchless terminal count indication. While a particular embodiment of the invention has been described, it is not intended that the invention be limited thereby, as it is intended that the invention be broad in scope and that the specifications be read likewise. Thus, while particular logic circuitry has been described for providing the desired results, those skilled in the art will appreciate that many different logic arrangements can be provided. For example, on a most simple level, AND and OR gates can be respectively replaced by NAND and NOR gates and inverters. Likewise, if desired, the control signals and terminal count signal could be active high rather than active low, and the flip-flops could transfer information on the descending edge of the clock cycle rather than on the rising edge. Further, while a four bit digital counter was shown, those skilled in the art will appreciate that the invention is not so limited, and that the counter can have a capacity to count fewer or more bits as desired. In fact, if desired, the counter can be arranged in a manner known to those skilled in the art to provide a decimal count (one to ten, or zero to nine) rather than a strict binary count, although for purposes herein, the term "binary" is intended to be broad and to encompass any base two counting. Indeed, other desired features available in the prior art are intended to be included in the invention such as a proper indication of terminal count after either a master or synchronous reset. Further yet, it will be appreciated that some or all of the provided circuit could be an integrated circuit or could be comprised of discrete components. Therefore, it will be apparent to those skilled in the art that yet other changes and modifications may be made to the invention as described without departing from the spirit and scope of the invention as so claimed.

I claim:

1. A digital counter having a clock signal as an input thereto, comprising:

(a) a state logic means for providing a digital count, said state logic means having inputs and outputs, and said clock signal being an input thereto;

(b) a next state decode means having inputs and outputs for providing at its outputs a code representing the state that said state logic means is to assume at a next clock cycle, said digital count being an input to said next state decode means, and said state logic means being controlled by and being coupled to the output of said next state decode means and being controlled by said clock signal;

(c) next terminal count decode means for providing a first indication at its output that said digital output count will reach a terminal count at said next clock cycle, wherein said outputs of said next state decode means are coupled to the inputs of said next terminal count decode means;

(d) terminal count logic means coupled to said next terminal count decode means and being controlled by said clock signal to obtain said first indication from said next terminal count decode means, and to provide a second indication at an output of said terminal count logic means at said next clock cycle that a terminal count has been reached.

2. A digital counter according to claim 1, wherein: said state logic means comprises a plurality of flip-flop means.

3. A digital counter according to claim 1, wherein: said next terminal count decode means has an output, and said terminal count logic means comprises a flip-flop means coupled to logical circuitry means, wherein said clock signal and said output of said next terminal count decode means are inputs to said flip-flop means such that when said next terminal count decode means provides said first indication to the input of said flip-flop means, said flip-flop means changes its output value at said next clock cycle, thereby causing said logical circuitry means to provide said second indication.

4. A digital counter according to claim 1, wherein: said next terminal count decode means comprises one of an AND and a NAND gate having a plurality of inputs, wherein said plurality of gate inputs of said one of an AND and a NAND gate are coupled to the outputs of said next state decode means.

5. A digital counter according to claim 3, wherein: said next terminal count decode means comprises one of an AND and a NAND gate having a plurality of inputs, wherein said plurality of gate inputs of siad one of an AND and a NAND gate are coupled to the outputs of said next state decode means.

6. A digital counter according to claim 5, wherein: said state logic means comprises a plurality of second flip-flop means.

7. A digital counter according to claim 1, further comprising:

(e) logical count preset means for accepting digital data input signals as an initial count and for causing said state logic means to assume a count corresponding to said digital data input signals.

8. A digital counter according to claim 7, wherein: said next state decode means is comprised of a plurality of logic gates, said logical count preset means is comprised of at least some of said plurality of logic gates of said next state decode means, and said logical count preset means further comprises a control means for at least partially controlling the state of said plurality of logic gates.

9. A digital counter according to claim 6, further comprising:
   (e) logical count preset means for accepting digital data input signals as an initial count and providing at its outputs a code representing the state that said state logic means is to assume at said next clock cycle.

10. A digital counter according to claim 9, wherein:
   said next state decode means is comprised of a plurality of logic gates,
   said logical preset means is comprised of at least some of said plurality of logic gates of said next state decode means, and
   said logical count preset means further comprises a control means for at least partially controlling the state of said plurality of logic gates.

11. A digital counter according to claim 1, further comprising:
   (e) count direction logic means for determining the direction of counting, wherein in a first direction of counting said count direction logic means causes said terminal count logic means to provide said second signal upon reaching a high terminal count, and in a second direction of counting sad count direction logic means causes said terminal count logic means to provide said second signal upon reaching a low terminal count.

12. A digital counter according to claim 4, further comprising:
   (e) count direction logic means for determining the direction of counting, wherein in a first direction of counting said count direction logic means causes said terminal count logic means to provide said second signal upon reaching a high terminal count, and in a second direction of counting sad count direction logic means causes said terminal count logic means to provide said second signal upon reaching a low terminal count, wherein
   said next terminal count decode means further comprises one of an OR and a NOR gate having a plurality of inputs, wherein said plurality of gate inputs of said one of an OR and a NOR gate are coupled to the outputs of said next state decode means.

13. A digital counter according to claim 7, further comprising:
   (f) count direction logic means for determining the direction of counting, wherein in a first direction of counting said count direction logic means causes said terminal count logic means to provide said second signal upon reaching a high terminal count, and in a second direction of counting sad count direction logic means causes said terminal count logic means to provide said second signal upon reaching a low terminal count.

14. A digital counter according to claim 13, wherein:
   said next state decode means is comprised of a plurality of logic gates,
   said logical count preset means is comprised of at least some of said plurality of logic gates of said next state decode means,
   said logical count preset means further comprises a control means for at least partially controlling the state of said plurality of logic gates.

* * * * *